(12) United States Patent
Lee et al.

(10) Patent No.: US 9,257,493 B2
(45) Date of Patent: Feb. 9, 2016

(54) ORGANIC LIGHT-EMITTING DIODE DISPLAY DEVICE

(71) Applicant: LG Display Co., Ltd., Seoul (KR)

(72) Inventors: JungHyun Lee, Paju-si (KR);
JunYoung Huh, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/093,887

(22) Filed: Dec. 2, 2013

(65) Prior Publication Data

US 2014/0167009 A1    Jun. 19, 2014

(30) Foreign Application Priority Data

Dec. 13, 2012  (KR) .................. 10-2012-0145657

(51) Int. Cl.
*H01L 29/04* (2006.01)
*H01L 27/32* (2006.01)
*H01L 23/522* (2006.01)

(52) U.S. Cl.
CPC ........ *H01L 27/3272* (2013.01); *H01L 23/5225* (2013.01); *H01L 27/32* (2013.01); *H01L 27/3241* (2013.01); *H01L 27/3244* (2013.01); *H01L 27/3288* (2013.01)

(58) Field of Classification Search
CPC ............ H01L 27/3272; H01L 27/3241; H01L 27/3244; H01L 27/3288; H01L 27/32; H01L 23/5225

USPC ................. 257/40, 59, 72, E51.001, E51.024
See application file for complete search history.

(56) References Cited

U.S. PATENT DOCUMENTS

| 2005/0017247 A1* | 1/2005 | Koo et al. ................... 257/72 |
| 2006/0274012 A1* | 12/2006 | Hong et al. ................. 345/95 |
| 2010/0006844 A1* | 1/2010 | Kim .................. H01L 27/1288 257/59 |
| 2013/0093658 A1* | 4/2013 | Park ................ G02F 1/13452 345/92 |
| 2013/0140538 A1* | 6/2013 | Fujita et al. ................. 257/40 |

* cited by examiner

*Primary Examiner* — Galina Yushina
(74) *Attorney, Agent, or Firm* — Fenwick & West LLP

(57) ABSTRACT

The present invention discloses an organic light-emitting diode display device. More particularly, the present invention relates to the structure of an organic light-emitting diode display device for suppressing a vertical crosstalk phenomenon in the organic light-emitting diode display device having an internal compensation structure for threshold voltage variations in driving transistors. According to an embodiment of the present invention, a shield electrode may be formed using the same metal layer as that of scan lines or data lines, thereby providing an organic light-emitting diode display device in which the effect of coupling between the gate electrode of driving thin-film transistors and the data lines is minimized.

4 Claims, 6 Drawing Sheets

ORGANIC LIGHT-EMITTING DIODE DISPLAY DEVICE

CROSS-REFERENCE TO RELATED APPLICATIONS

This application claims the benefit of Korean Patent Application No. 10-2012-0145657, filed on Dec. 13, 2012, which is hereby incorporated by reference for all purposes as if fully set forth herein.

BACKGROUND OF THE INVENTION

1. Field of the Invention

The present invention relates to an organic light-emitting diode display device, and more particularly, to the structure of an organic light-emitting diode display device for suppressing a vertical crosstalk phenomenon in the organic light-emitting diode display device having an internal compensation structure for threshold voltage variations in driving transistors.

2. Description of the Related Art

Flat panel display devices proposed for replacing the existing cathode ray tube display devices may include liquid crystal displays, field emission displays, plasma display panels, organic light-emitting diode (OLED) displays, and the like.

Of the types proposed, organic light-emitting diodes may provide advantages such as high brightness and low operation voltage characteristics, and a high contrast ratio because of being operated as a self luminous type that spontaneously emits light, and allowing the implementation of an ultra-thin display. Furthermore, the organic light-emitting diodes have characteristics such as facilitating the implementation of moving images with a response time of several microseconds (µs), having no limitation in viewing angle, and having stability, even at low temperatures.

Figure 1:
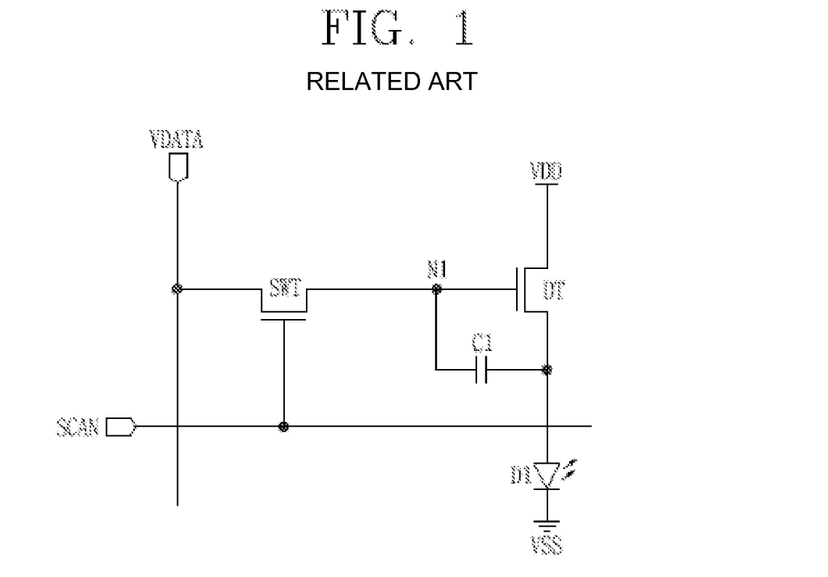
FIG. 1 is a view illustrating an equivalent circuit diagram of one pixel in an organic light-emitting diode display device in the related art.

FIG. 1 is a view illustrating an equivalent circuit diagram of one pixel in an organic light-emitting diode display device in the related art.

As illustrated in the drawing, in the organic light-emitting diode display device, a scan signal (Scan) line and a data signal (Vdata) line are formed in a crossed manner with each other, and a line for supplying a power voltage (VDD) is formed to be separated from the data signal (Vdata) line by a predetermined distance to form one pixel (PX).

Furthermore, the organic light-emitting diode display device may include a switching thin-film transistor (SWT) for applying the data signal (Vdata) to a first node (Ni) in response to the scan signal (Scan), and a driving thin-film transistor (DT) for receiving the driving voltage (VDD) at the source electrode and applying a drain current to the organic light-emitting diode (EL) according to a voltage applied to the first node (N1), and a capacitor (C1) for maintaining a voltage applied to a gate electrode of the driving thin-film transistor (DT) for a period of one frame.

Furthermore, the organic light-emitting diode (EL) may include an organic light-emitting layer formed between the cathode electrode and anode electrode, the anode electrode being connected to the drain electrode of the driving thin-film transistor (DT), and the cathode electrode being grounded (VSS). The organic light-emitting layer may include a hole transporting layer, an light emitting layer, and an electron transporting layer.

The foregoing organic light-emitting diode display device controls a current amount flowing through the organic light-emitting diode (EL) to display the gradation of an image, and the image quality is determined by the characteristics of the driving thin-film transistor (DT).

Figure 2:
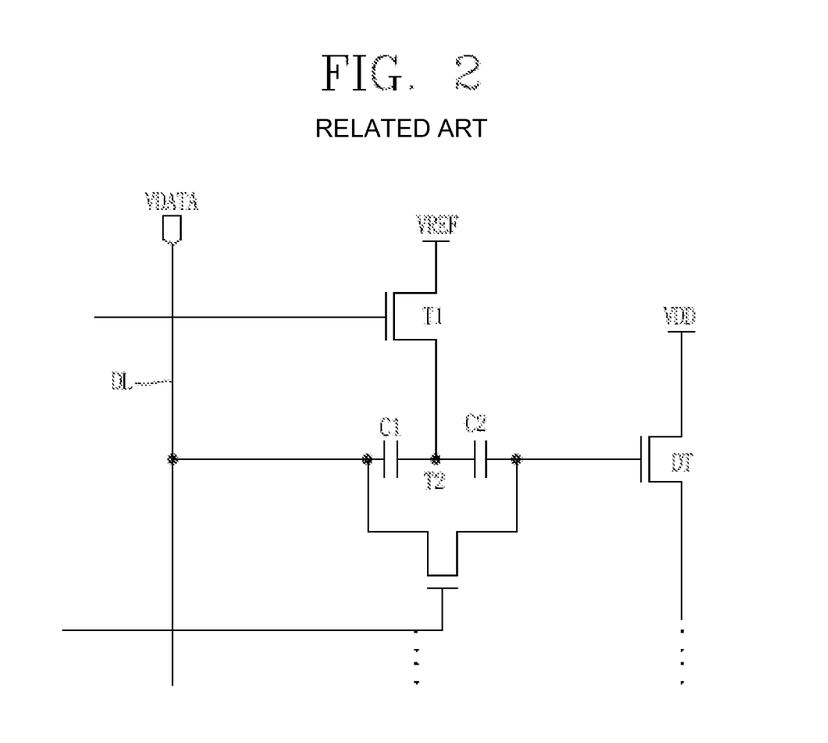
FIG. 2 is a view illustrating part of a pixel in an organic light-emitting diode display device with an internal compensation structure in the related art.

However, a threshold voltage variation between the driving thin-film transistors of different pixels may occur, even within one display panel, and a current flowing through each organic light-emitting diode (EL) may be changed, thereby causing a problem in which the desired gradation cannot be implemented. In order to address this problem, an internal compensation type pixel structure in which one or more sampling thin-film transistors (T1, T2) and a plurality of capacitors (C1, C2) for applying a reference voltage (VREF) are added, as illustrated in FIG. 2, to compensate a threshold voltage variation by sensing the threshold voltage of the driving thin-film transistor (DT) and removing a threshold voltage component sensed on the drain current of the driving thin-film transistor (DT) has been proposed.

However, the foregoing internal compensation type pixel structure requires that a larger number of thin-film transistors are provided compared to the related art FIG. 1, and therefore it has a disadvantage of reducing the aperture ratio.

Furthermore, the pixel may be designed in such a manner that the maximum aperture ratio can be secured in a limited pixel space, and therefore, a line connected to the gate electrode of the driving thin-film transistor (DT) is disposed adjacent to the data line (DL), and a voltage applied to the gate electrode is fluctuated due to the effect of coupling caused by a voltage change of the data line (DL) according to the parasitic capacitance, thereby varying the gate voltage of the driving thin-film transistor. It may change the drain current of the driving thin-film transistors, thereby causing image quality deterioration such as a vertical crosstalk.

SUMMARY OF THE INVENTION

The present invention is contrived to solve the foregoing problem, and an object of the present invention is to provide an organic light-emitting diode display device for suppressing an image quality deterioration problem due to a parasitic capacitance between the gate electrode of the driving thin-film transistor and the data line in the organic light-emitting diode display device with an internal compensation structure.

In order to accomplish the foregoing object, an organic light-emitting diode display device according to an embodiment of the present invention may include a substrate; a scan line formed in a first direction on the substrate; a data line formed in a second direction perpendicular to the first direction to define a pixel region at a position crossed with the scan line; a plurality of thin-film transistors formed in the pixel region; an organic light-emitting diode electrically connected to a driving thin-film transistor, and a shield electrode formed at a lower layer of the data line adjacent to an electrode electrically connected to a gate electrode of the driving thin-film transistor.

The shield electrode may be formed of the same metal layer as that of the scan line and gate electrode.

The shield electrode may be overlapped with the data line.

An electrode that is electrically connected to the gate electrode may form a capacitor with an opposite electrode at an upper portion thereof.

The shield electrode may be in a floating state or a DC voltage with a fixed voltage level may be applied thereto.

In order to accomplish the foregoing object, an organic light-emitting diode display device according to another embodiment of the present invention may include a substrate; a scan line formed in a first direction on the substrate; a data line formed in a second direction perpendicular to the first direction to define a pixel region at a position crossed with the scan line; a plurality of thin-film transistors formed in the pixel region; an organic light-emitting diode electrically connected to a driving thin-film transistor; and a shield electrode formed between an electrode electrically connected to a gate electrode of the driving thin-film transistor and the data line.

The shield electrode may be formed of the same metal layer as that of the data line.

The shield electrode may be formed in parallel with an electrode that is electrically connected to the data line and the gate electrode.

The shield electrode may be in a floating state or a DC voltage with a fixed voltage level that is applied thereto.

In an organic light-emitting diode display device according to an embodiment of the present invention, a shield electrode may be formed using the same metal layer as that of the scan line or data line, thereby minimizing the effect of coupling between the gate electrode of the driving thin-film transistor and the data line. Accordingly, it has an effect of providing an organic light-emitting diode display device for suppressing a vertical cross-talk phenomenon and implementing a high-definition image.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Hereinafter, an organic light-emitting diode display device according to a preferred embodiment of the present invention will be described with reference to the accompanying drawings.

Figure 3:
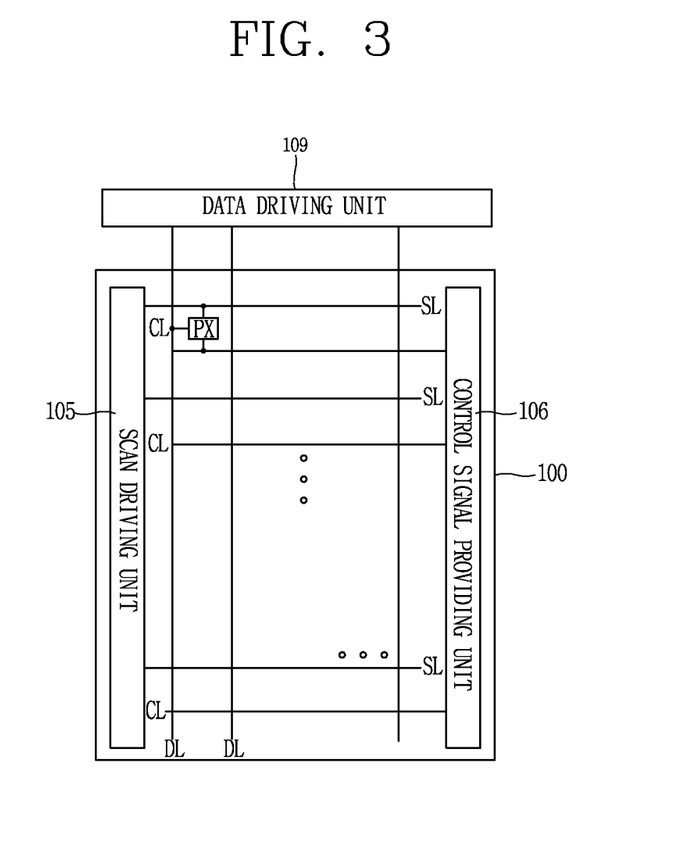
FIG. 3 is a view illustrating an overall structure of an organic light-emitting diode display device according to an embodiment of the present invention.

FIG. 3 is a view illustrating an overall structure of an organic light-emitting diode display device according to an embodiment of the present invention.

As illustrated in the drawing, in an organic light-emitting diode display device according to the present invention, a plurality of scan lines (SLs) and data lines (DLs) crossed with each other are formed on a substrate 100 to define pixels (PXs) at positions on which the scan lines (SLs) and data lines (DLs) are crossed with each other. Furthermore, a plurality of control signal lines (CLs) arranged in the direction parallel to which the scan lines (SLs) are formed and connected to the pixels (PXs).

Each of the pixels (PXs) is formed at a central portion of the organic light-emitting diode display device, and a scan driving unit 105 for applying a scan signal to the scan lines (SLs), a control signal providing unit 106 for applying control signals to the control signal lines (CLs), and a data driving unit 109 for applying data signals to the data lines (DLs) are disposed at an edge portion thereof.

Though not shown in the drawing, each of the pixels (PXs) comprises at least one organic light-emitting diode, thin-film transistor, and capacitor. Here, the organic light-emitting diode may include a first electrode (hole injection electrode), an organic compound layer, and a second electrode (electron injection electrode).

The organic compound layer may further include various organic layers for effectively transporting hole or electron carriers to a light-emitting layer in addition to the light-emitting layer in which light is actually emitted. The organic layers may be a hole injection layer and a hole transporting layer located between the first electrode and the light-emitting layer, and an electron injection layer and an electron transporting layer located between the second electrode and the light-emitting layer.

Furthermore, a thin-film transistor provided in each pixel is made of a driving thin-film transistor for controlling a current that flows through a plurality of thin-film transistors and organic light-emitting diodes for threshold voltage sampling. In particular, one of the thin-film transistors for sampling is connected to a scan line and a data line to transmit a data signal received at the data line to the driving thin-film transistor according to a switching voltage received at the scan line. A capacitor is connected to a switching transistor and a power supply line to store a voltage proportional to a difference between a data voltage transmitted from the switching transistor and a voltage from which a threshold voltage of the driving thin-film transistor sampled through the reference voltage is removed.

The driving transistor is connected to a power supply line and a capacitor to supply an output current corresponding to the voltage stored in the capacitor to the organic light-emitting diode, and the organic light-emitting diode emits light due to the output current. Here, the driving transistor may include a gate electrode, a source electrode, and a drain electrode, and an anode electrode of the organic light-emitting diode may be connected to the drain electrode of the driving transistor.

Furthermore, in one embodiment, a pad (PAD) bonded to a printed circuit board for receiving power voltages, ground voltages, and other signals for driving the organic light-emitting diode display device from the outside is formed at an upper portion of the data driving unit 109.

The pixels (PXs) are sequentially driven in a given scan line (SL) by the scan signal (Scan), which is applied through each of the scan lines (SLs) to display gradation corresponding to the data signal applied through the data lines (DLs). Though not shown in the drawing, each of the pixels (PXs) may include an organic light-emitting diode and a plurality of thin-film transistors for driving the organic light-emitting diode, and each thin-film transistor is being connected to the foregoing scan line (SL), data line (DL), power supply line, and ground supply line to display gradation according to the applied signal.

Figure 4:
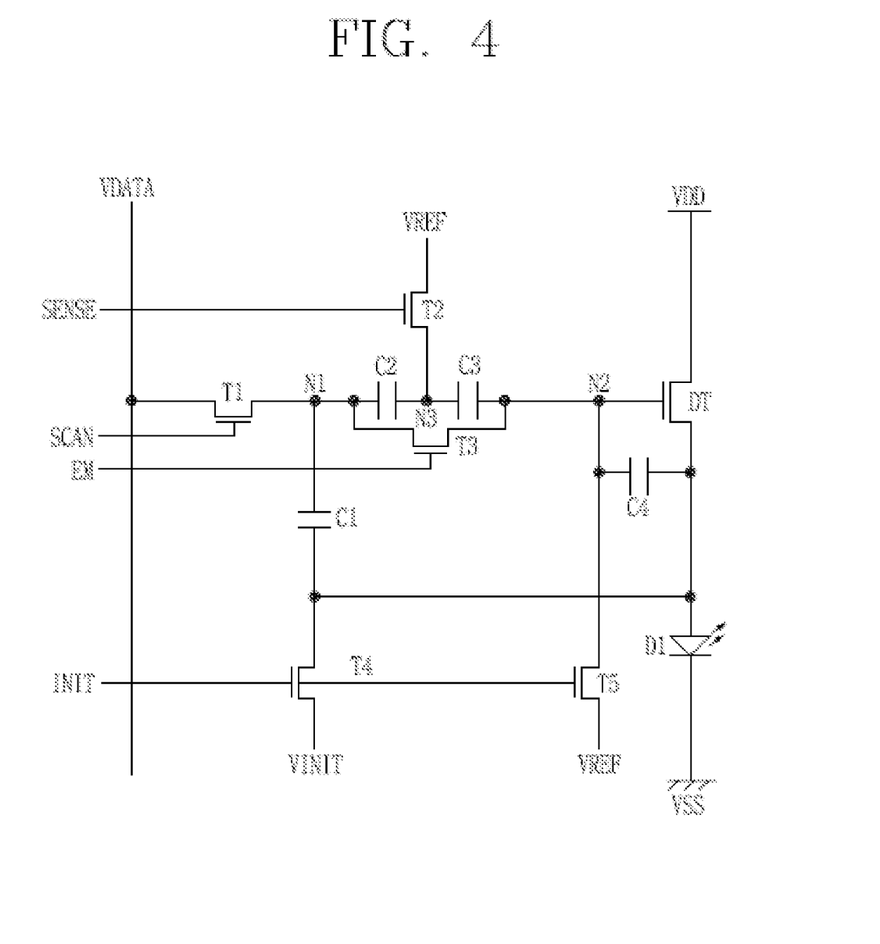
FIG. 4 is a view illustrating an equivalent circuit diagram of one pixel in an organic light-emitting diode display device in FIG. 3.

FIG. 4 is a view illustrating an equivalent circuit diagram of one pixel in an organic light-emitting diode display device in FIG. 3, according to one embodiment.

As illustrated in the drawing, one pixel of the organic light-emitting diode display device may include a driving thin-film transistor (DT), four capacitors (C1-C4), and a plurality of thin-film transistors (T1-T5) for threshold voltage compensation.

A gate electrode of the first thin-film transistor (T1) is connected to the scan line, and a drain and a source electrode thereof are connected to the data line and a first node (N1), respectively.

A gate electrode of the second thin-film transistor (T2) is connected to a sense signal line and a source electrode thereof is connected to the third node (N3), and a reference voltage (VREF) is applied to a drain electrode thereof.

An EM signal (EM) is applied to a gate electrode of the third thin-film transistor (T3), and a drain and a source electrode thereof are connected to the first and second nodes (N1, N2), respectively.

An Init control signal (INIT) is applied to a gate electrode of the fourth thin-film transistor (T4), and an initialization voltage (VINIT) is applied to a drain electrode thereof, and a source electrode thereof is connected to the second node (N2).

An Init control signal (INIT) is applied to a gate electrode of the fifth thin-film transistor (T5), and the reference voltage (VREF) is applied to a drain electrode thereof, and a source electrode thereof is connected to the second node (N2).

A gate electrode of the driving thin-film transistor (DT) is connected to the second node (N2), and the power voltage (VDD) is applied to a drain electrode thereof, and the organic light-emitting diode is connected to a source electrode thereof.

The first capacitor (C1) is connected between the first node (N1) and the fourth thin-film transistor (T4), and the second and third capacitors (C2, C3) are connected to the first and second nodes (N1, N2) by interposing the third node therebetween. The fourth capacitor (C4) is connected between the gate electrode and source electrode of the driving thin-film transistor (DT).

According to the foregoing structure, when the initialization signal (INIT) and EM signal (EM) are applied thereto, the fourth and fifth thin-film transistors (T4, T5) charge the first and second nodes (N1, N2) to the initialization voltage (VINIT) and reference voltage (VREF), respectively. Next, the EM signal (EM) is applied to charge the first node (N1) to the reference voltage (VREF), and when the data voltage (VDATA) is applied to the first node (N1) through the first transistor along the scan signal (SCAN), the voltage of the second node (N2) is boosted at the second node (N2) due to the coupling of the second and third capacitors (C2, C3), and thus the second node (N2) is charged to the power voltage (VDD) with a threshold voltage (Vth), a voltage corresponding to a difference between the reference voltage (VREF) and data voltage (VDATA), and as a result, a current (IOLED) flowing to the organic light-emitting diode (D1) through the driving thin-film transistor (DT) satisfies the following equation:

$$IOLED = \tfrac{1}{2}k(VDATA - VREF)^2 \qquad [\text{Equation 1}]$$

Here, k denotes a proportionality constant, namely, a value decided by a structure and a physical characteristic of the driving thin-film transistor (DT). k may be decided by mobility of the driving thin-film transistor (DT), a ratio of a channel length L to a channel width W of the driving thin-film transistor (DT), and the like.

Consequently, an organic light-emitting diode display device according to the present invention compensates for a threshold voltage variation in the driving thin-film transistor between pixels.

Accordingly, in the foregoing structure, the gate electrode of the driving thin-film transistor (DT) is electrically connected to the third capacitor (C3) through the second node (N2), and two electrodes of the third capacitor (C3) are formed adjacent to the data line according to the pixel structure. In particular, a voltage change of the data line has an effect on the second node (N2), namely, the gate electrode of the driving thin-film transistor (DT) and a line electrically connected to the gate electrode due to coupling in a fringe shape. In order to minimize the coupling effect, an organic light-emitting diode display device according to an embodiment of the present invention is characterized in that a shield electrode is further provided between a data line, a gate electrode of the driving thin-film transistor (DT), and a line that is electrically connected to the gate electrode.

Hereinafter, the pixel structure of an organic light-emitting diode display device according to an embodiment of the present invention will be described in detail with reference to the drawings.

Figure 5:
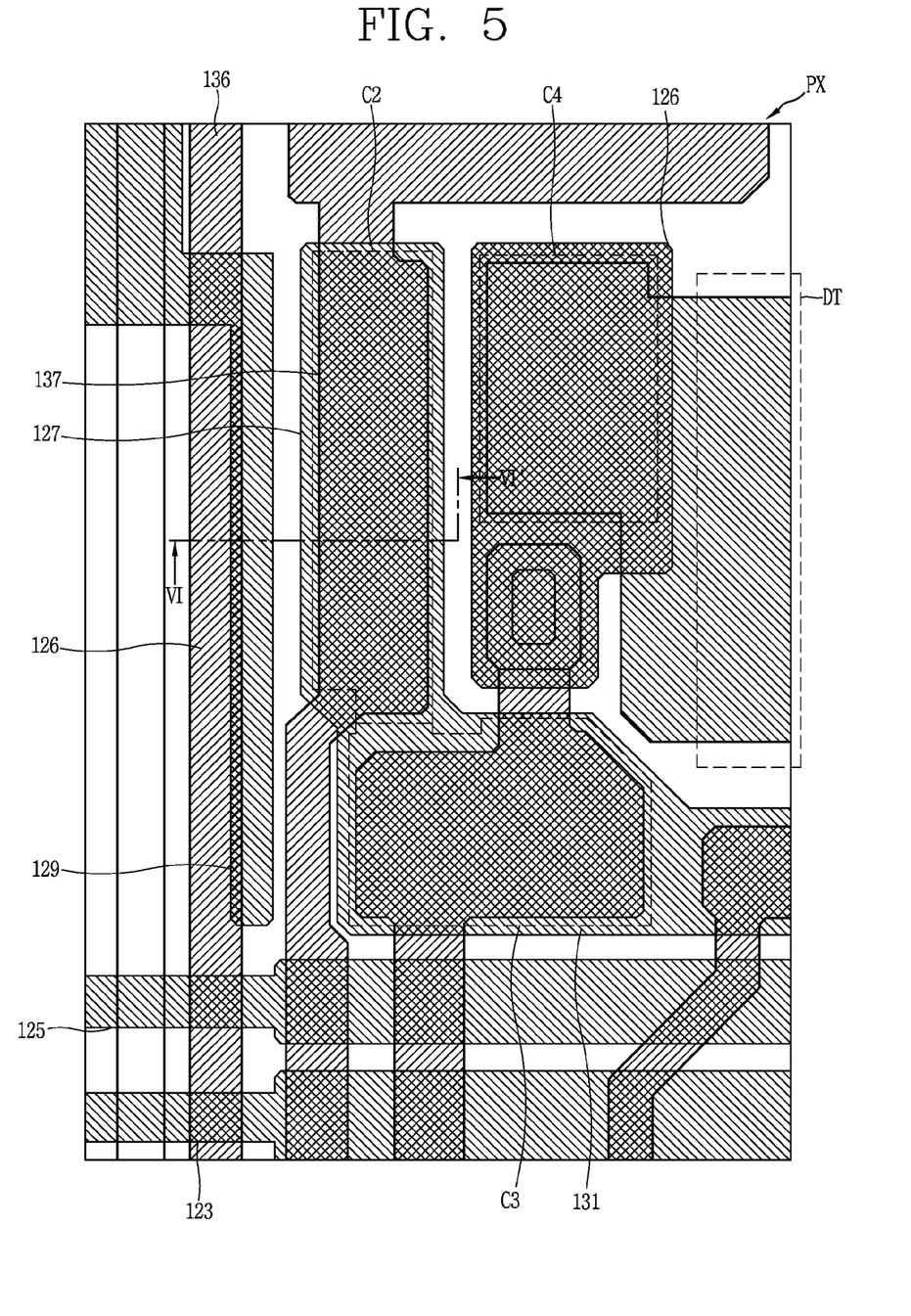
FIG. 5 is a plan view illustrating part of a pixel in an organic light-emitting diode display device according to an embodiment of the present invention.
Figure 6:
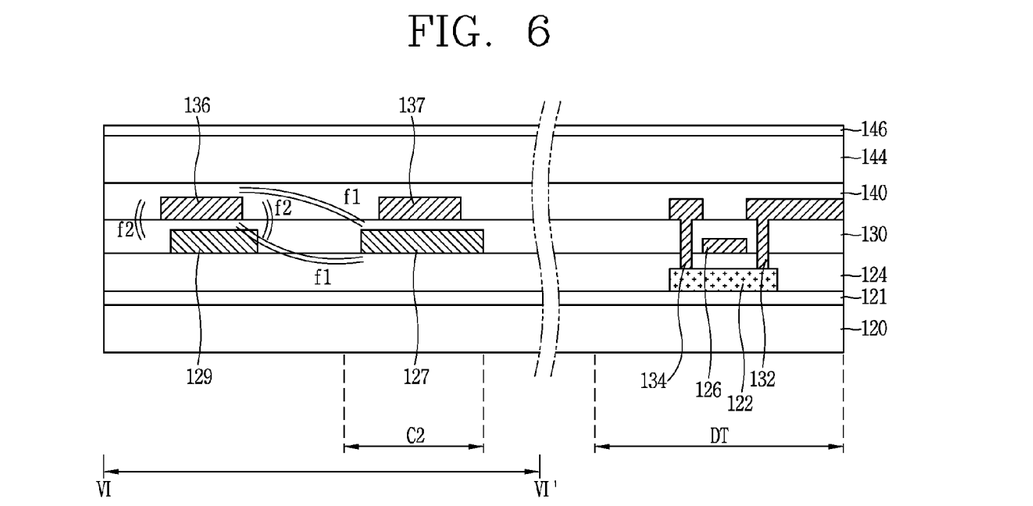
FIG. 6 is a view illustrating a portion along line VI-VI and a cross section of a driving thin-film transistor in FIG. 5, according to one embodiment.

FIG. 5 is a plan view illustrating part of a pixel in an organic light-emitting diode display device according to an embodiment of the present invention, and FIG. 6 is a view illustrating a portion along line VI-VI∝ and a cross section of a driving thin-film transistor in FIG. 5, according to one embodiment.

Referring to the drawings, one pixel of the organic light-emitting diode display device according to the present invention may include a driving thin-film transistor (DT) and capacitors (C2-C4) formed on the substrate 120. Furthermore, though not shown in the drawing, the pixel according to the present invention may further include a plurality of switching transistors, a first capacitor, and an organic light-emitting diode (not shown).

The substrate 120 may be formed of a solid material such as glass or a flexible material such as plastic.

An active layer 122 of the switching thin-film transistor (not shown) and the driving thin-film transistor (DT) are formed on an upper layer of the substrate 120, and a gate insulation layer 124 is formed on an upper layer of the active layer 122.

A gate electrode 126 of the switching transistor (not shown) and the driving thin-film transistor (DT) are formed on an upper layer of the gate insulation layer 124 corresponding to the active layer 122. Here, part of the gate electrode 126 of the driving thin-film transistor (DT) is extended to form a lower electrode of the fourth capacitor (C4), and the lower electrode is electrically connected to an upper electrode 131 of the third capacitor (C3) through a contact hole. The lower electrode corresponding to the upper electrode 131 of the third capacitor (C3) is extended to form a lower electrode 127 of the second capacitor (C2). Accordingly, the lower electrode of the second capacitor (C2) is electrically connected to the gate electrode of the driving thin-film transistor (DT).

On the other hand, when viewed from the plane, a Sense signal line 123 and an Initial signal line 125 are formed in a first direction at a lower region of the pixel (PX), and though not shown in the drawing, a scan line and an EM line (not shown) are formed parallel to the first direction in the upward direction. The foregoing Sense signal line 123 and Initial signal line 125 are formed in the same layer and with the same metal as that of the gate electrode.

Furthermore, when viewed from the cross section, an interlayer insulation layer 130 is formed on an upper layer of the gate electrode 126, and a source electrode 132 and a drain electrode 134 of the driving thin-film transistor are formed on an upper layer of the 130. Furthermore, a data line 136 is formed in a second direction on the same layer. Here, though not shown in the drawing, a switching transistor (not shown) may be formed with the same cross-sectional configuration as that of the driving transistor (DT).

Furthermore, a passivation layer 140 covers the driving transistor (DT), the data line 136, and an upper electrode 137 of the second capacitor (C2), the source electrode 132 and drain electrode 134 are formed on layer 130 within passivation layer 140, and a bank layer 144 is formed on the passivation layer 140. A cathode electrode 146 constituting one electrode of the organic light-emitting diode is formed on an upper layer of the bank layer 144.

In particular, an organic light-emitting diode display device according to an embodiment of the present invention is characterized in that a shield electrode 129 is further formed on the same layer as the gate electrode 126 and the lower electrode 127 of the second capacitor (C2), and at a level lower than the data line 136. The shield electrode 129 is formed to be overlapped with the data line 136 at the upper and lower layers thereof, and also formed to be inclined in the direction of the lower electrode 127 of the second capacitor (C2) and adjacent thereto.

According to the foregoing structure, a conventional coupling capacitance (f1) generated between the data line 136 and the lower electrode 127 of the second capacitor (C2) is shielded by a coupling capacitance (f2) between the data line 136 and the shield electrode 129 to minimize the effect. Accordingly, a gate voltage applied to the gate electrode of the driving thin-film transistor (DT) electrically connected to one electrode of the second capacitor (C2) maintains a stable waveform.

Here, the shield electrode 129 may be in a floating state or in a state in which a DC voltage with a fixed voltage level is applied thereto.

Hereinafter, a method of fabricating an organic light-emitting diode display device according to an embodiment of the present invention will be described with reference to the drawings. On the drawings, the structure of a driving thin-film transistor, and a second capacitor and a data line electrically connected to a gate electrode of the driving thin-film transistor is illustrated.

Figure 7A:
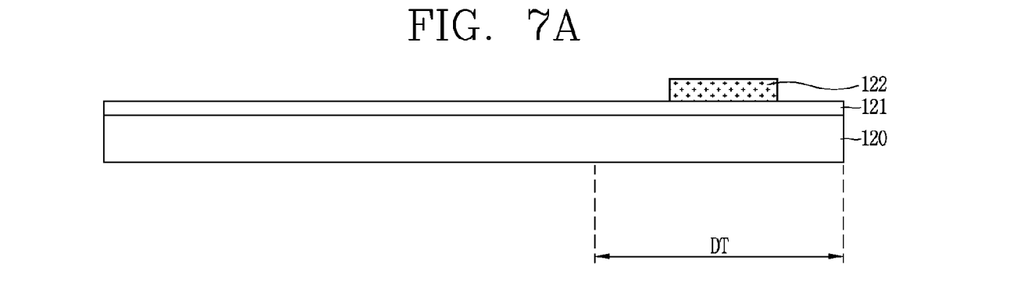
FIGS. 7A through 7C are views illustrating a method of fabricating an organic light-emitting diode display device according to an embodiment of the present invention.
Figure 7B:
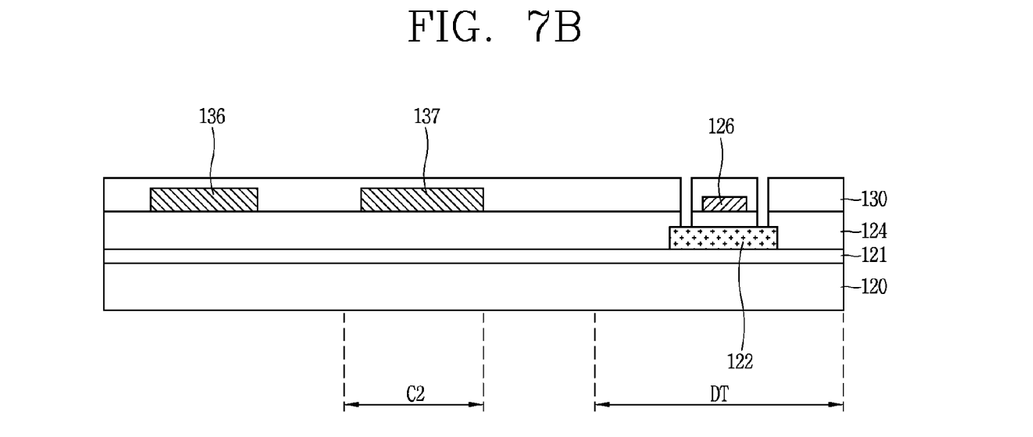
Figure 7C:
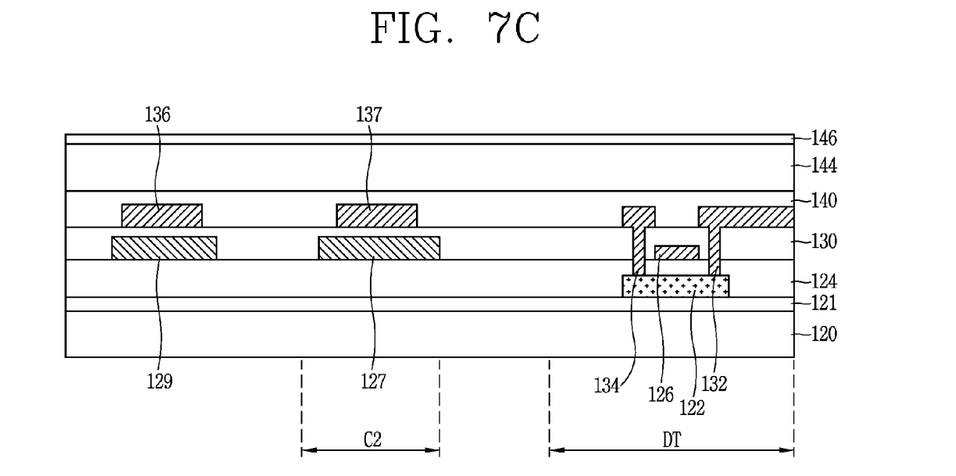

FIGS. 7A through 7C are views illustrating a method of fabricating an organic light-emitting diode display device according to an embodiment of the present invention.

First, referring to FIG. 7A, a substrate 120 in which a plurality of pixel regions are defined is prepared. Here, the substrate 120 may be formed of a transparent glass substrate with a solid material for implementing a typical display device or a transparent plastic material having a flexible characteristic to maintain the display's performance if the organic light-emitting diode display device is bent like a paper.

Next, a buffer layer 121 made of an insulating material, for example, silicon oxide ($SiO_2$) or silicon nitride (XiNx), which is an inorganic insulating material. Here, the buffer layer 121 may perform the role of preventing characteristic deterioration due to the emission of alkali ions from the inside of the substrate 120 during the crystallization of the semiconductor layer 122 formed in the subsequent process.

Subsequently, referring to FIG. 7B, the semiconductor layer 122 made of pure polysilicon and comprising a first region that forms a channel at a central portion thereof and a second region doped with impurities having a high concentration at both lateral surfaces of the first region, is formed to correspond to the driving transistor (DT) within a pixel region at an upper portion of the buffer layer 121. Next, the gate insulation layer 124 is formed at an upper portion of the buffer layer 121 including the semiconductor layer 122, and the gate electrode 126 is formed to correspond to the first region of the semiconductor layer 122 on the gate insulation layer 124.

The foregoing gate electrode 126 may be made of a first metal material having a low resistance characteristic, for example, any one of aluminum (Al), aluminum alloy (AlNd), copper (Cu), copper alloy, molybdenum (Mo), and molly titanium (MoTi), to have a single layer structure, or made of two or more of the foregoing metal materials to have a double layer or triple layer structure.

At the same time, the shield electrode 129 and the data line are formed. The shield electrode 129 is formed to be disposed between the lower electrode 127 and the data line, and to correspond to a location at which the lower electrode 127 of the second capacitor (C2) is electrically connected to the gate electrode 126.

Next, the interlayer insulation layer 130 made of an insulating material, for example, silicon oxide ($SiO_2$) or silicon nitride (XiNx), which is an inorganic insulating material, is formed on an entire surface of the substrate at an upper portion of the gate electrode 126, lower electrode 127, and shield electrode 129.

Subsequently, the interlayer insulation layer 130 and the gate insulation layer 124 at a lower portion thereof are selectively patterned to form a semiconductor layer contact hole for exposing part of the second region located at both lateral surfaces of the first region of each semiconductor layer 122.

Next, as illustrated in FIG. 7C, a second metal material layer (not shown) is formed at an upper portion of the interlayer insulation layer 130 including the semiconductor layer contact hole. Here, the second metal material layer may be consisted of any one or any combination of two or more of aluminum (Al), aluminum alloy (AlNd), copper (Cu), copper alloy, molybdenum (Mo), molly titanium (MoTi), chromium (Cr), and titanium (Ti).

Subsequently, a second material layer is selectively patterned to form the source and drain electrodes 132, 134 of the driving transistor (DT), an upper electrode 137 of the second capacitor (C2), and the data line 136.

At this time, the shield electrode 129 formed at the same time as the gate electrode 126 is disposed at a layer lower than the data line 136 so as to be extended in the same direction and parallel thereto, and the shield electrode 129 may be formed such that it completely overlaps with the data line 136 or formed to be inclined to the lower electrode 127 of the second capacitor (C2).

Furthermore, though all of the source electrode 132, drain electrode 134, upper electrode 137, and data line 136 have a single layer structure in FIGS. 7B and 7C, they may be also formed to have a double layer or triple layer structure.

Next, the passivation layer 140 and bank layer 144 are sequentially formed over an entire surface of the substrate 120. At this time, an insulating material, for example, silicon oxide ($SiO_2$) or silicon nitride (XiNx), which is an inorganic insulating material, may be used for the passivation layer 140.

Next, a third metal material layer (not shown) is deposited on an entire surface of the passivation layer 140 to form a cathode electrode 146 of the organic light-emitting diode. The cathode electrode 146 may be formed over an entire surface of the substrate 120 or formed with a separate section for each pixel. The cathode electrode 146 may be formed from any one or two or more materials selected from the group consisting of aluminum (Al), aluminum alloy (AlNd), copper (Cu), copper alloy, molybdenum (Mo), molly titanium (MoTi), chromium (Cr), and titanium (Ti).

Although not shown in the drawing, the cathode electrode 146 is electrically connected to a source electrode 132 of the driving transistor (DT) at a lower portion thereof through a contact hole.

Then, an organic light-emitting layer consisted of organic light-emitting patterns for emitting red, green and blue, respectively and an anode electrode (not shown) are sequentially deposited on the cathode electrode 146 to form an organic light-emitting diode, and an insulation substrate (not shown) is attached thereto, thereby completing an organic light-emitting diode display device.

Here, the foregoing organic light-emitting layer may be configured with a single layer made of an organic light emitting material, and otherwise, though not shown in the drawing, may be configured with multiple layers including a hole injection layer, a hole transporting layer, an emitting material layer, an electron transporting layer, and an electron injection layer.

Accordingly, according to a method of fabricating an organic light-emitting diode display device in accordance with the present invention a shield electrode may be formed to be overlapped in a direction in parallel with the data line to be formed at an upper layer thereof during the formation of a gate electrode of the driving thin-film transistor and a lower electrode of the second capacitor to minimize the effect of coupling due to a parasitic capacitance existing between the lower electrode of the second capacitor connected to the gate electrode of the driving thin-film transistor and the data line. As a result, a gate voltage applied to the gate electrode of the driving thin-film transistor is stably maintained, thereby suppressing vertical crosstalk due to the coupling of the gate voltage.

On the other hand, the foregoing shield electrode may be configured with a data metal layer constituting the data line in addition to a gate metal layer constituting the gate electrode, and the structure of an organic light-emitting diode display device according to another embodiment of the present invention will be described below with reference to FIG. 8.

Figure 8:
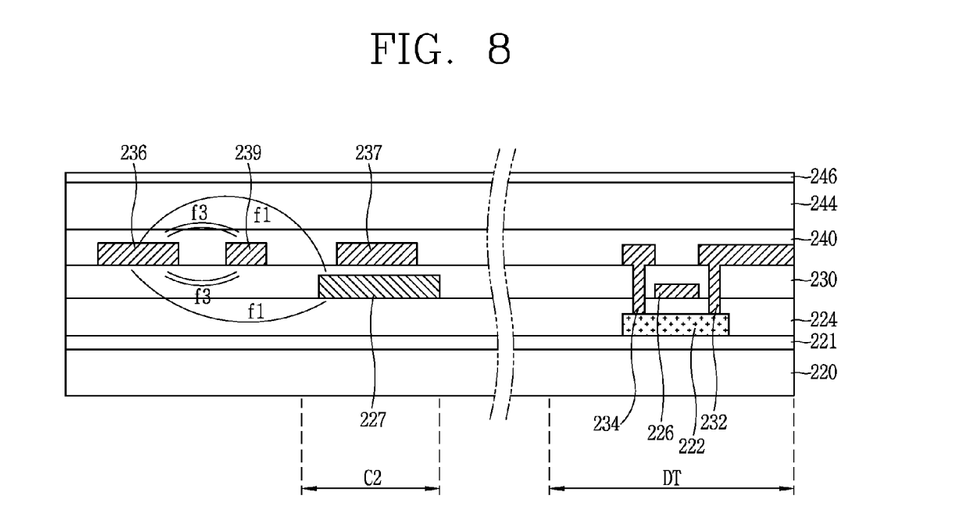
FIG. 8 is a plan view illustrating part of a pixel in an organic light-emitting diode display device according to another embodiment of the present invention.

FIG. 8 is a plan view illustrating part of a pixel in an organic light-emitting diode display device according to another embodiment of the present invention.

Referring to the drawings, one pixel of the organic light-emitting diode display device according to the present invention may include a driving thin-film transistor (DT) and at least one capacitor formed on a substrate 220. In addition, though not shown in the drawing, the pixel according to the present invention may include a plurality of switching transistors, a plurality of capacitors, and an organic light-emitting diode (not shown).

An active layer 222 of the driving thin-film transistor (DT) is formed on an upper layer of the substrate 220, and a gate insulation layer 224 is formed on an upper layer of the active layer 222.

A gate electrode 226 of the driving thin-film transistor (DT) is formed on an upper layer of the gate insulation layer 224 corresponding to the active layer 222. Here, part of the gate electrode 226 of the driving thin-film transistor (DT) is extended and electrically connected to a lower electrode 227 of the second capacitor (C2).

An interlayer insulation layer 230 is formed on an upper layer of the gate electrode 226, and a source electrode 232 and a drain electrode 234 of the driving thin-film transistor (DT) are formed on an upper layer of the 230. Furthermore, a data line 236 is formed in a second direction on the same layer.

Furthermore, a passivation layer 240 that covers the driving transistor (DT), the data line 236, and an upper electrode 237 of the second capacitor (C2) is formed on an upper layer of the source electrode 232 and drain electrode 234, and a bank layer 244 is formed on an upper layer of the passivation layer 240.

According to another embodiment of the present invention a shield electrode 239 is further formed between the data line 236 and the upper electrode 237 of the second capacitor (C2) within the same metal layer as that of the data line 236. In other words, there is a difference in that in the previous embodiment the shield electrode (reference numeral 129 in FIG. 6) is formed with the same gate metal layer as that of the gate electrode, but the shield electrode 239 in the embodiment illustrated in FIG. 8 is formed within the same data metal layer as that of the data line.

The shield electrode 239 shown in FIG. 8 may be formed in parallel with the data line 236 on the same horizontal line, and therefore, a coupling capacitance (f1) generated between the data line 236 and the lower electrode 227 of the second capacitor (C2) is shielded by a coupling capacitance (f2) between the data line 236 and the shield electrode 239 to minimize the effect. Accordingly, a gate voltage applied to the gate electrode of the driving thin-film transistor (DT) that is electrically connected to one electrode of the second capacitor (C2) maintains a stable waveform.

Although numerous embodiments have been specifically disclosed in the foregoing description, they should be construed as an illustration of preferred embodiments rather than a limitation to the scope of invention. Consequently, the invention should not be determined by the embodiments disclosed herein but rather by the following claims and the equivalents thereof.

What is claimed is:

1. An organic light-emitting diode display device, comprising:
   a substrate;
   scan lines formed in a first direction on the substrate;
   data lines in a second direction perpendicular to the first direction to define pixel regions at positions crossed with the scan lines;
   a plurality of thin-film transistors in a pixel region;
   an organic light-emitting diode electrically connected to a driving thin-film transistor; and
   a shield electrode formed in a layer lower than the data lines adjacent to a lower electrode of a capacitor, said lower electrode of the capacitor being electrically connected to a gate electrode of the driving thin-film transistor and an upper electrode of the capacitor being adjacent to at least one of the data lines,
   wherein the shield electrode is disposed in a same layer as the scan lines or the gate electrode, and the shield electrode is physically separated from the scan lines and the gate electrode of the driving thin-film transistor.

2. The organic light-emitting diode display device of claim 1, wherein the shield electrode is overlapped by one of the data lines.

3. The organic light-emitting diode display device of claim 1, wherein the shield electrode is in a floating state or a DC voltage with a fixed voltage level is applied thereto.

4. The organic light-emitting diode display device of claim 1, wherein the shield electrode is disposed along a direction of the data lines.

* * * * *